United States Patent [19]
Tsuji et al.

[11] Patent Number: 5,204,539
[45] Date of Patent: Apr. 20, 1993

[54] AVALANCHE PHOTODIODE WITH HETERO-PERIODICAL STRUCTURE

[75] Inventors: Masayoshi Tsuji; Kikuo Makita, both of Tokyo, Japan

[73] Assignee: NEC Corporation, Japan

[21] Appl. No.: 826,494

[22] Filed: Jan. 27, 1992

[30] Foreign Application Priority Data

Jan. 28, 1991 [JP] Japan .................................. 3-8179
Mar. 28, 1991 [JP] Japan ................................. 3-64266

[51] Int. Cl.$^5$ ........................................... H01L 27/14
[52] U.S. Cl. .................................... 257/21; 257/187;
257/186; 257/438; 257/185
[58] Field of Search ................. 357/30 A, 30 E, 30 P, 357/16, 4, 13

[56] References Cited

U.S. PATENT DOCUMENTS

| | | | |
|---|---|---|---|
| 4,731,641 | 3/1988 | Matsushima et al. | 357/30 A |
| 4,942,436 | 7/1990 | Vetterling | 357/30 A X |

FOREIGN PATENT DOCUMENTS

| | | | |
|---|---|---|---|
| 1-144687 | 6/1989 | Japan | 357/30 A |
| 1-194476 | 8/1989 | Japan | 357/30 A |
| 2-10780 | 1/1990 | Japan | 357/30 A |
| 2-119274 | 5/1990 | Japan | 357/30 A |
| 2-246381 | 10/1990 | Japan | 357/30 A |

OTHER PUBLICATIONS

V. Lehman and U. Gösele, "Porous Silicon Formation: A Quantum Wire Effect", *Applied Physics Letters*, vol. 58, No. 8, Feb. 25, 1991, pp. 856-858.

L. T. Canhan, "Silicon Quantum Wire Array Fabrication by Electrochemical and Chemical Dissolution of Wafers", *Applied Physics Letters*, vol. 57, No. 10, Sep. 3, 1990, pp. 1046-1048.

*Primary Examiner*—William Mintel
*Attorney, Agent, or Firm*—Laff, Whitesel, Conte & Saret

[57] ABSTRACT

An avalanche photodiode includes an avalanche multiplication layer of a hetero-periodical structure consisting of alternately provided barrier and well layers. Each barrier layer includes a multi-quantum barrier layer consisting of alternately provided short-width barrier and well layers. The barrier and well layers include respectively first and second III-group elements which meet the following conditions:

$$E_A < E_B, \text{ and } E_A + E_{gA} < E_B + E_{gB}$$

or $$E_A < E_B, \text{ and } E_A + E_{gA} > E_B + E_{gB}$$

where $E_A$ and $E_B$ are average ionization energies of the first and second III-group elements respectively, and $E_{gA}$ and $E_{gB}$ are forbidden band gap energies, respectively.

12 Claims, 15 Drawing Sheets

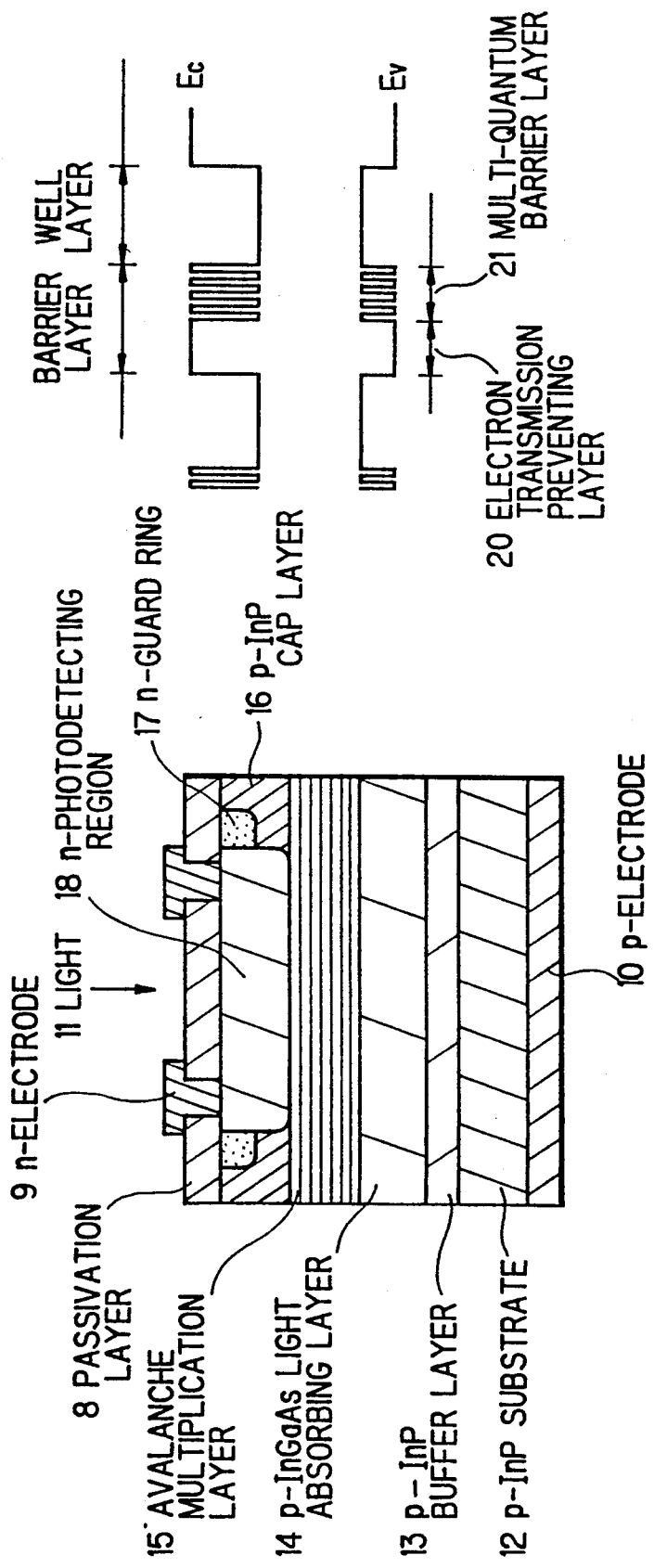

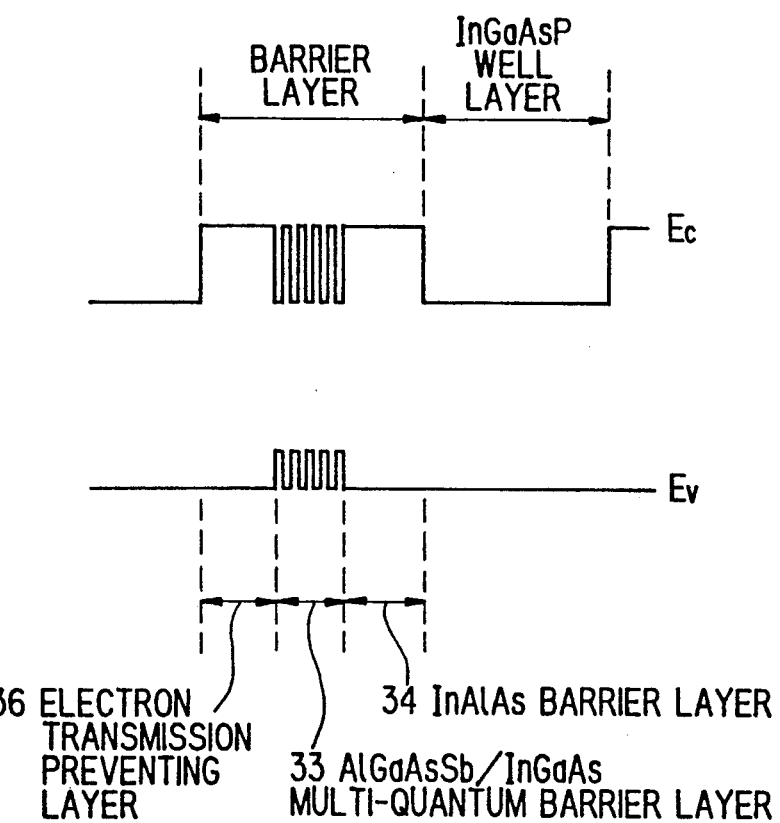

FIG. 15A
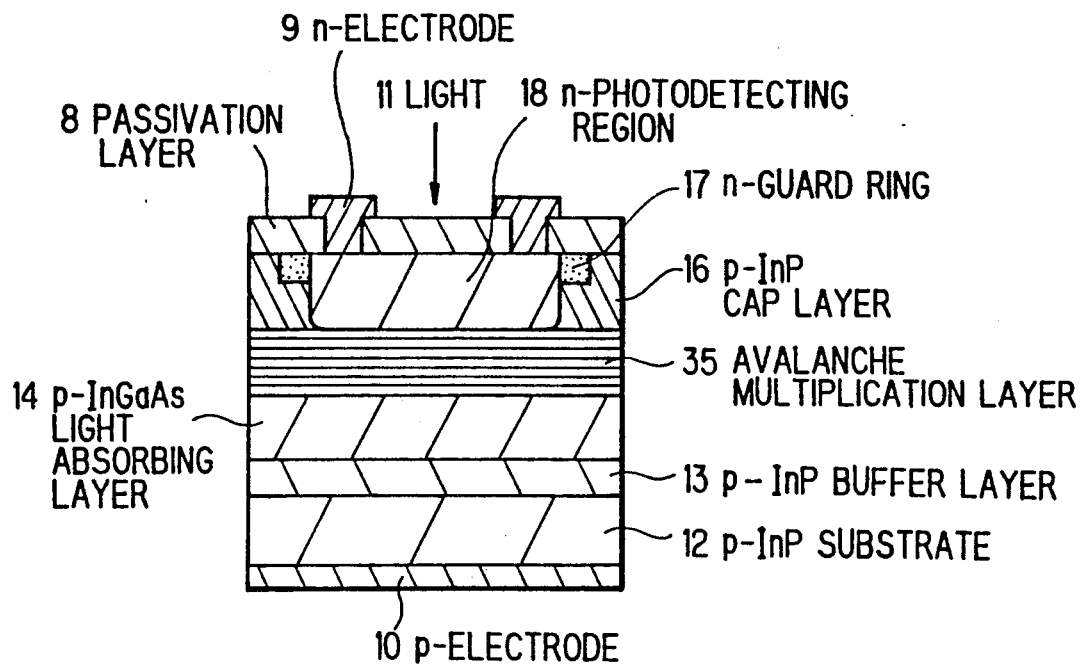
FIG. 15B

AVALANCHE PHOTODIODE WITH HETERO-PERIODICAL STRUCTURE

FIELD OF THE INVENTION

This invention relates to a photodiode, and more particularly to, an avalanche photodiode used in optical telecommunication systems, optical information processing systems, optical measuring systems, etc.

BACKGROUND OF THE INVENTION

There are several semiconductor photodetectors sensitive to wavelengths of 1.0 to 1.6 μm for optical telecommunication systems, such as a PIN photodetector including a light absorbing layer of $In_{0.53}Ga_{0.47}As$ lattice matched to an InP substrate as described on pages 653 and 654 of "Electronics Letters, vol. 20, 1984", or an avalanche photodetector as described on pages 257 and 258 of "IEEE. Electron Device Letters, vol. 7, 1986". The photodetector such as an avalanche photodiode has been used in long distance optical telecommunications systems, because it has an advantage in inner gain effects and high speed response due to avalanche multiplication.

One type of a conventional avalanche photodiode includes a buffer layer formed on a substrate, an avalanche multiplication layer formed on the buffer layer, a light absorbing layer formed on the avalanche multiplication layer, and a photodetecting region formed on the avalanche multiplication layer.

In operation, light is supplied to the avalanche photodiode which is applied with a reverse bias voltage. The light is absorbed at the light absorbing layer to generate photocarriers that are electrons and holes. The photocarriers are injected into the avalanche multiplication layer to cause ionization impacts which results multiplication under an intensive electric field. It is desirable that the ionization impacts in the avalanche multiplication layer are carried out only by the photocarriers injected from the light absorbing layer. Therefore, it is desirable that the electron and hole ionization rates $\alpha$ and $\beta$ are vastly different ($\alpha > \beta$ or $\alpha < \beta$) and the photocarriers injected from the light absorbing layer initiate the avalanche process to provide an avalanche photodiode having low-noise and high speed response characteristics. The ratio $\alpha/\beta$ depends on property of material of which the avalanche multiplication layer consists. In an InGaAs type avalanche photodiode having an InP avalanche multiplication layer in which holes are injected carriers, for instance, the ratio $\beta/\alpha$ of InP is up to 2 at the most, which is far smaller than the ratio $\alpha/\beta$ of Si which is approximately 20.

Capasso et al have suggested that the ratio $\alpha/\beta$ can be controlled artificially by using a superlattice structure having large band energy discontinuity of the conduction band ($\Delta E_c$) as an avalanche multiplication layer, as described on pahes 38 to 40 of "Applied Physics Letters, vol. 40, 1982".

According to the conventional avalanche photodiode including the superlattice structure, however, there is a disadvantages in that noise and speed response characteristics are not sufficient, because the ratio of ionization rates which is dependent on material of which the avalanche multiplication layer of the avalanche photodiode consists is not sufficiently high. Further, there occurs a so-called pile-up of holes at the band energy discontinuity of the valence band ($\Delta E_v$), so that the band width may be reduced. In order to prevent the pile-up of holes, it is proposed that the avalanche multiplication layer should consist of InAlAs/InGaAsP or AlGaAsSb/AlGaInAs structure so that the band energy discontinuity of the valence band $\Delta E_v$ becomes zero. However, the band energy discontinuity of the conduction band $\Delta E_c$ is also reduced, so that the ratio of the ionization rates is reduced.

SUMMARY OF THE INVENTION

Accordingly, it is an object of the invention to provide an avalanche photodiode having low-noise and high speed response performances.

According to a feature of the invention, an avalancge photodiode comprises:

a light absorbing layer;

an avalanche multiplication layer of a heteroperiodical structure consisting of alternately provided barrier and well layers, each of the barrier layers of the avalanche multiplication layer comprising a multi-quantum barrier layer consisting of alternately provided narrow width barrier and well layers; and first and second electrodes for applying a predetermined voltage across the light absorbing and avalanche multiplication layer;

wherein the barrier and well layers comprise respectively first and second III-group elements which meed the following conditions:

$$E_A < E_B, \text{ and } E_A + B_{zA} < E_B + E_{zB}$$

where $E_A$ and $E_B$ are average ionization energies of the first and second group VIII compounds, respectively, and $E_{zA}$ and $E_{zB}$ are forbidden band gap energies, respectively.

BRIEF DESCRIPTION OF THE

The invention will be explained in more detail in conjunction with appended drawings wherein:

FIG. 4A is a cross-sectional view illustrating the avalanche photodiode in the first preferred embodiment according to the invention;

FIG. 4B is a simplified model illustrating the band energy in the avalanche multiplication layer of the avalanche photodiode in FIG. 4A;

FIG. 12B is a simplified model illustrating the band energy in the avalanche multiplication layer of the avalanche photodiode in FIG. 11A;

FIG. 12 is a simplified model illustrating the band energy in an avalanche multiplication layer of an avalanche photodiode in a fifth preferred embodiment according to the invention;

FIG. 15A is a cross-sectional view illustrating the avalanche photodiode in the sixth preferred embodiment according to the invention; and FIG. 15B is a simplified model illustrating the band energy in the avalanche multiplication layer of the avalanche photodiode in FIG. 15A.

DESCRIPTION OF THE PREFERRED EMBODIMENTS

Figure 1:
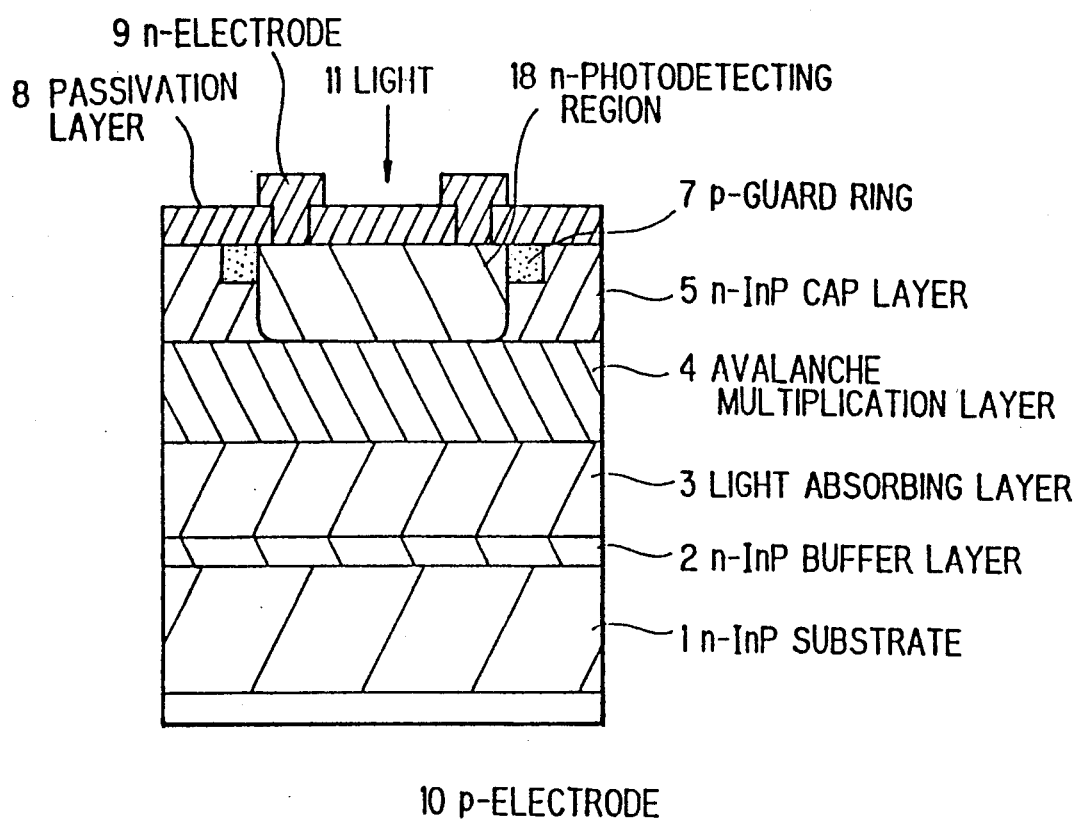
FIG. 1 is a cross-sectional view illustrating a conventional avalanche photodiode.

Before describing an avalanche photodiode in preferred embodiments according to the invention, the conventional avalanche photodiodes briefly described before will be explained in conjunction with FIG. 1.

The conventional avalanche photodiode includes an n-InP buffer layer 2 formed on an n-InP substrate 1, a light absorbing layer 3 formed on the n-InP buffer layer 2, an avalanche multiplication layer 4 formed on the light absorbing layer 3, an n-InP cap layer 5 formed on the avalanche multiplication layer 4, a p-photodetecting region 6 formed within the n-InP cap layer 5, and a p-guard ring 7 formed to surround the p-n photodetecting region 6. An p-electrode 10 and an n-electrode 9 are provided to have ohmic contacts with the p-photodetecting region 6 and the n-InP substrate 1, respectively. Additionally, a passivation layer 8 is formed on a top surface of the avalanche photodiode to cover all the surface thereof except for the p-electrode 9.

In operation, a light 11 is supplied to the avalanche photodiode which is applied with a reverse bias voltage between the n-electrode 9 and the p-electrode 10. The light 10 thus supplied is absorbed at the light absorbing layer 3 of InGaAs to generate photocarriers, which are electrons and holes. The holes are injected into the avalanche multiplication layer 4. There is a high intensity of field applied in the avalanche multiplication layer 4, so that ionization impacts by the injected holes occur to cause multiplication. However, the conventional avalanche photodiode having the structure thus explained has not sufficient performances of low-noise and high speed response.

Figure 2:
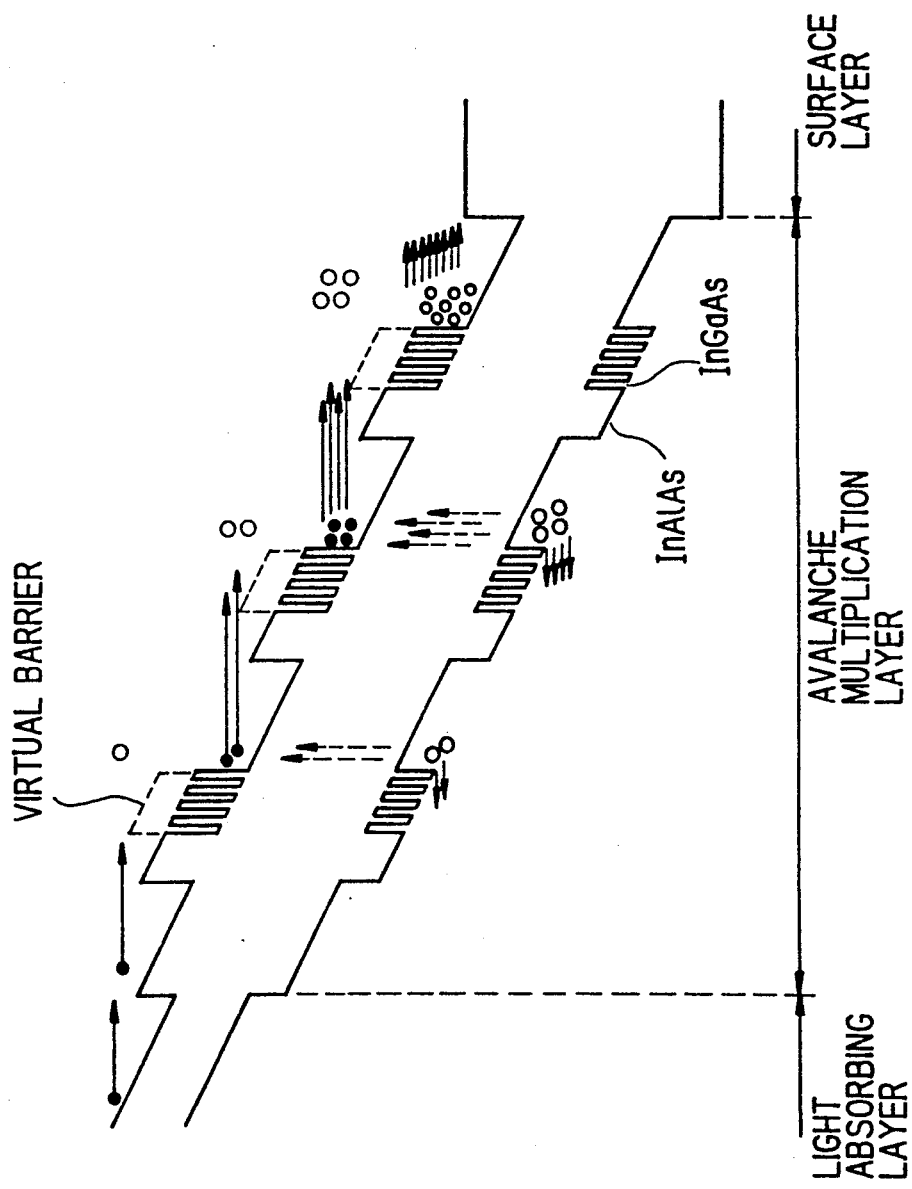
FIG. 2 is a simplified model illustrating the band energy for explaining an avalanche multiplication layer structure of an avalanche photodiode in a first preferred embodiment according to the invention.

Next, an avalanche photodiode in preferred embodiments according to the invention will be explained. FIG. 2 shows the band energy for explaining a structure of an avalanche multiplication layer of an avalanche photodiode in a first preferred embodiment. The avalanche multiplication layer has a hetero-periodical structure including a barrier layer consisting of an electron transmission preventing layer of $In_xAl_{1-x}As$ ($0 \leq x \leq 1$) and a multi-quantum barrier layer of $In_xAl_{1-x}As/In_yGa_{1-y}As$ ($0 \leq x \leq 1$, $0 \leq y \leq 1$) and a well layer of $In_yGa_{1-y}As$ ($0 \leq y \leq 1$). A virtual barrier higher than the real barrier is generated at the multi-quantum barrier layer, so that electrons which are injected into the avalanche multiplication layer experience the large energy differences between the virtual barrier and the well layer. Therefore, the electrons obtain a large ionizing energy.

Figure 3:
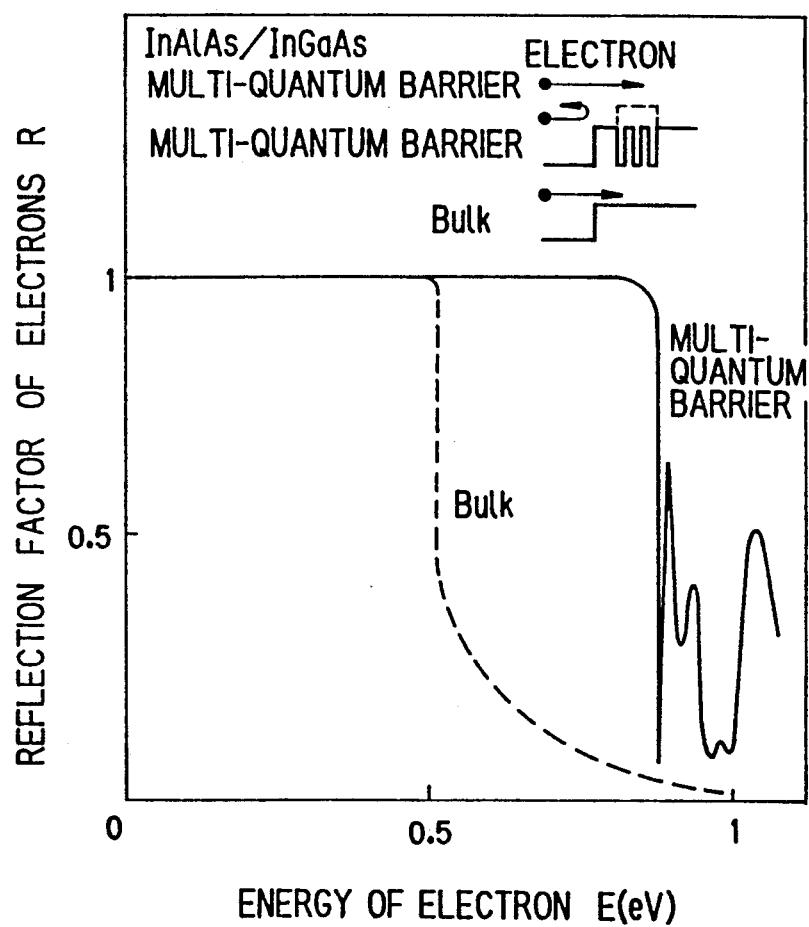
FIG. 3 is a graph showing a reflection factor of electrons correlating to energy of electrons in the structure shown in FIG. 2.

FIG. 3 shows a reflection factor of electrons correlating to energy of electrons in the multi-quantum barrier and the bulk interface in the avalanche multiplication layer structure shown in FIG. 2. When the electrons reach the bulk barrier in the avalanche multiplication layer, most of electrons having an energy over approximately 0.5 eV corresponding to the hetero barrier energy pass overcome the bulk barrier, so that the reflection factor decreases to be nearly zero. On the other hand, when the electrons reach the multi-quantum barrier, most of electrons having an energy up to approximately 0.9 eV, which is far higher than the hetero barrier energy, reflects at the multi-quantum barrier. In other words, the reflection factor of electrons in the multi-quantum barrier is 1.7 times larger than that in the bulk barrier.

Next, the avalanche photodiode in the first preferred embodiment will be explained in more detail in conjunction with FIGS. 4A and 4B. The avalanche photodiode includes a p-InP buffer layer 13 having a thickness of 0.5 μm formed on a p-InP substrate 12, a p-InGaAs light absorbing layer 14 having a thickness of 1.5 μm formed on the p-InP buffer layer 13, an avalanche multiplication layer 15 having a thickness of 1.0 μm formed on the light absorbing layer 14, a p-InP cap layer 16 having a thickness of 0.5 μm formed on the avalanche multiplication layer 15, an n-photodetecting region 18 having an impurity concentration of $1 \times 10^{18}$ cm$^{-3}$ by ion implantation of Si of $1 \times 10^{14}$ cm$^{-2}$ till a depth of 0.5 μm at 200 kV formed within the p-InP cap layer 16, and an n-guard ring 17 having an impurity concentration of $5 \times 10^{16}$ cm$^{-3}$ by ion implantation of Si of $1 \times 10^{18}$ cm$^{-2}$ till a depth of 3000 Å at 100 kV formed to surround the n-photodetecting region 18. An n-electrode 9 of AuGe/Ni having a thickness of 1500 Å and TiPtAu having a thickness of 500 Å and a p-electrode 10 of AuZn having a thickness of 1500 Å are provided to have ohmic contacts with the n-photodetecting region 18 and the p-InP substrate 12, respectively. Additionally, a passivation layer 8 having a thickness of 1500 Å is formed on a top surface of the avalanche photodiode to cover all the surface thereof except for the n-electrode 9.

The avalanche multiplication layer has a 16-period hetero-structure of an InAlAs-barrier layer having a thickness of 500 Å and an InGaAs-well layer having a thickness of 250 Å. The barrier layer consists of an electron transmission preventing layer of InAlAs having a thickness of 100 Å and a multi-quantum barrier layer having a 5-period structure of InAlAs having a thickness of 30 Å and InGaAs having a thickness of 20 Å.

In operation, only electrons of photocarriers generated in the light absorbing layer 14 are injected into the avalanche multiplication layer 15 by the high intensity of field applied therein. The electrons get an energy higher than that in the conventional avalanche multiplication layer, so that ionization of the electrons is promoted. On the other hand, the holes which drift on the valence band have masses larger than those of the electrons, so that the holes do not experience the effect of the multi-quantum barrier. Consequently, the ionization ratio $\alpha/\beta$ becomes large, so that low-noise and high speed response characteristics can be obtained.

In the avalanche photodiode, the ionization of electrons is promoted, so that an effective ionization ratio $\alpha/\beta$ becomes as large as 120. Further, the quantum efficiency becomes 80%, so that low-noise and high speed response characteristics are realized in the avalanche photodiode.

Figure 5B:
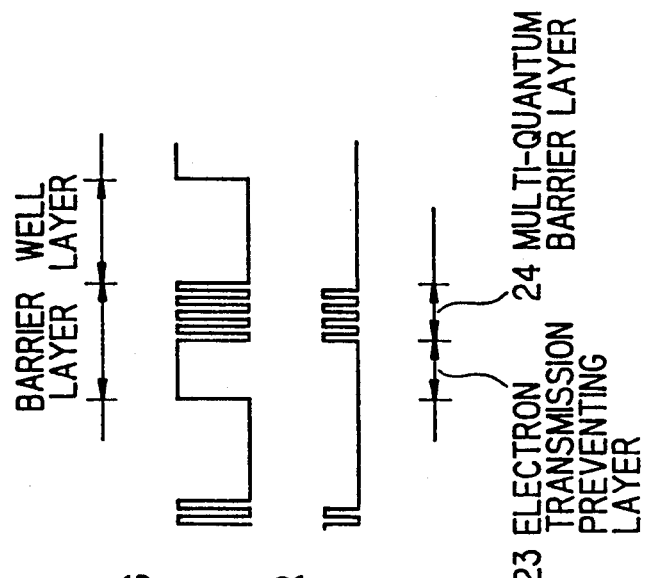
FIG. 5B is a simplified model illustrating the band energy in the avalanche multiplication layer of the avalanche photodiode in FIG. 5A.
Figure 5A:
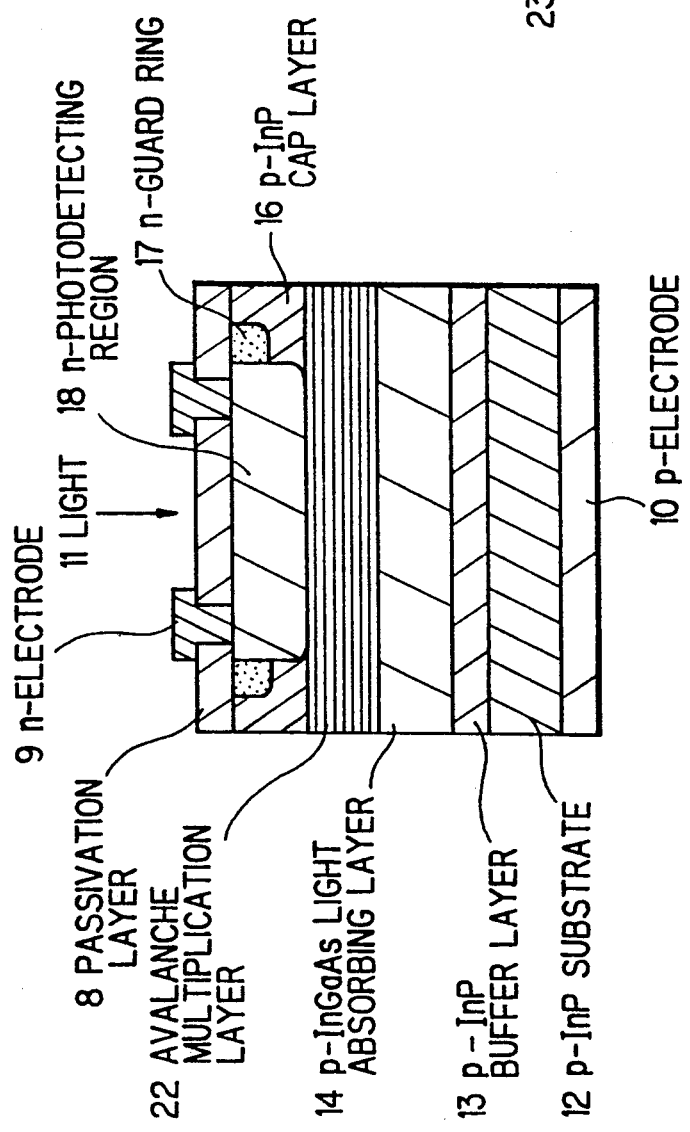
FIG. 5A is a cross-sectional view illustrating an avalanche photodiode in a second preferred embodiment according to the invention.

Next, an avalanche photodiode in a second preferred embodiment will be explained in conjunction with FIGS. 5A and 5B. The avalanche photodiode has the same structure as that of the avalanche photodiode in the first preferred embodiment, except that a well layer of an avalanche multiplication layer 22 consists of InGaAsP instead of InGaAs. The basic figure of the band energy in the avalanche multiplication layer 22 of the avalanche photodiode in the second preferred embodiment shown in FIG. 5B is the same as that shown in FIG. 2, except that there is almost no band energy discontinuity $\Delta E_V$ between the well layer and the barrier layer in the valence band, so that the pile-up of the holes does not occur. Therefore, higher speed response characteristics can be obtained in the avalanche photodiode.

Figure 6:
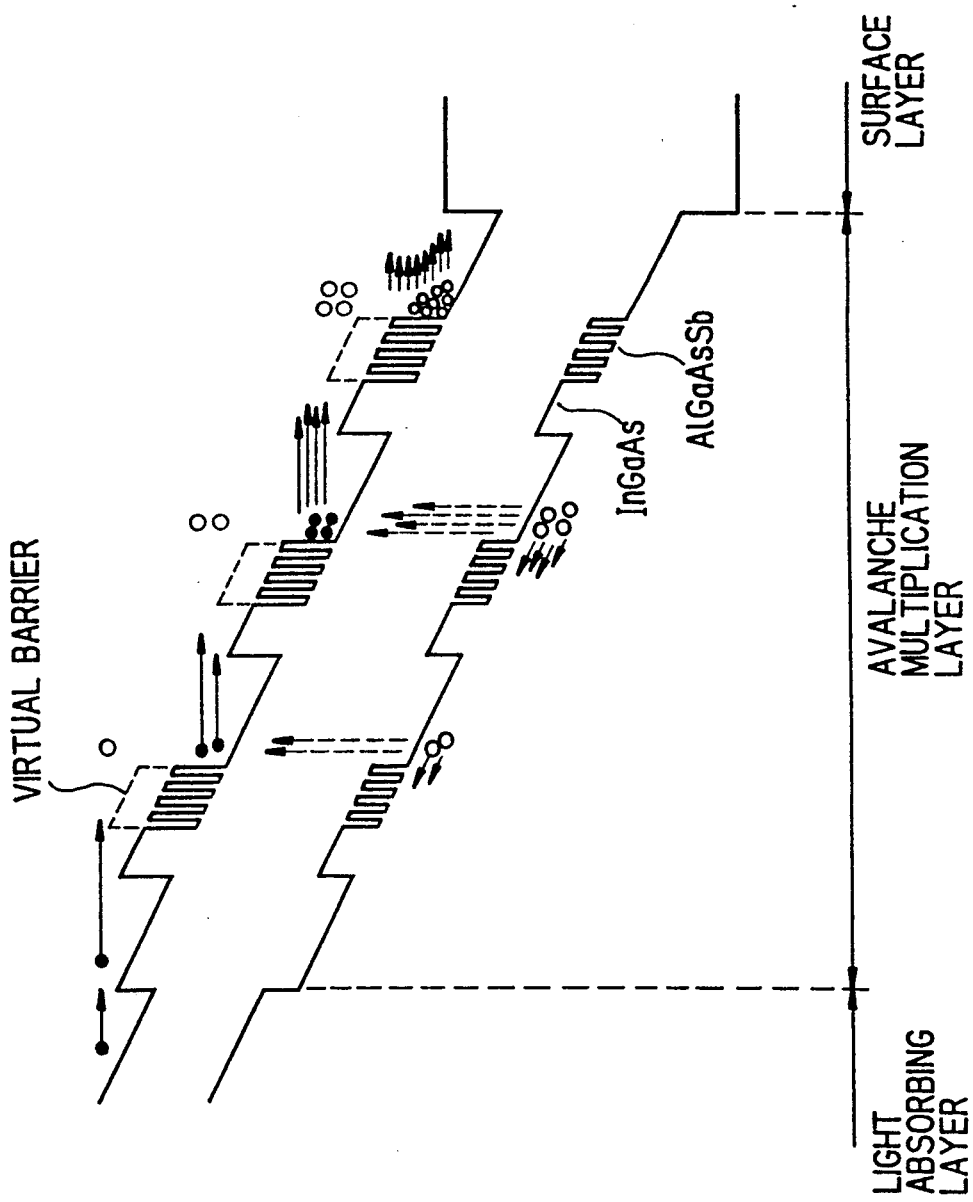
FIG. 6 is a simplified model illustrating the band energy for explaining an avalanche multiplication layer structure of an avalanche photodiode in a third preferred embodiment according to the invention.

Next, an avalanche photodiode in a third preferred embodiment will be explained. As shown in FIG. 6, an avalanche multiplication layer of the avalanche photodiode in the third preferred embodiment has a hetero-periodical structure including a barrier layer consisting of an electron transmission preventing layer of $Al_xGa_{1-x}As_ySb_{1-y}$ ($0 \leq x \leq 1$, $0 \leq y \leq 1$) and a multi-quantum barrier layer of $Al_xGa_{1-x}As_ySb_{1-y}/In_zGa_{1-z}As$ ($0 \leq x \leq 1$, $0 \leq y \leq 1$, $0 \leq z \leq 1$) and a well layer of $In_zGa_{1-z}As$ ($0 \leq z \leq 1$). A virtual barrier higher than the real barrier is generated at the multi-quantum barrier layer, and the electrons obtain a large ionizing energy, as shown in FIG. 2.

Figure 7:
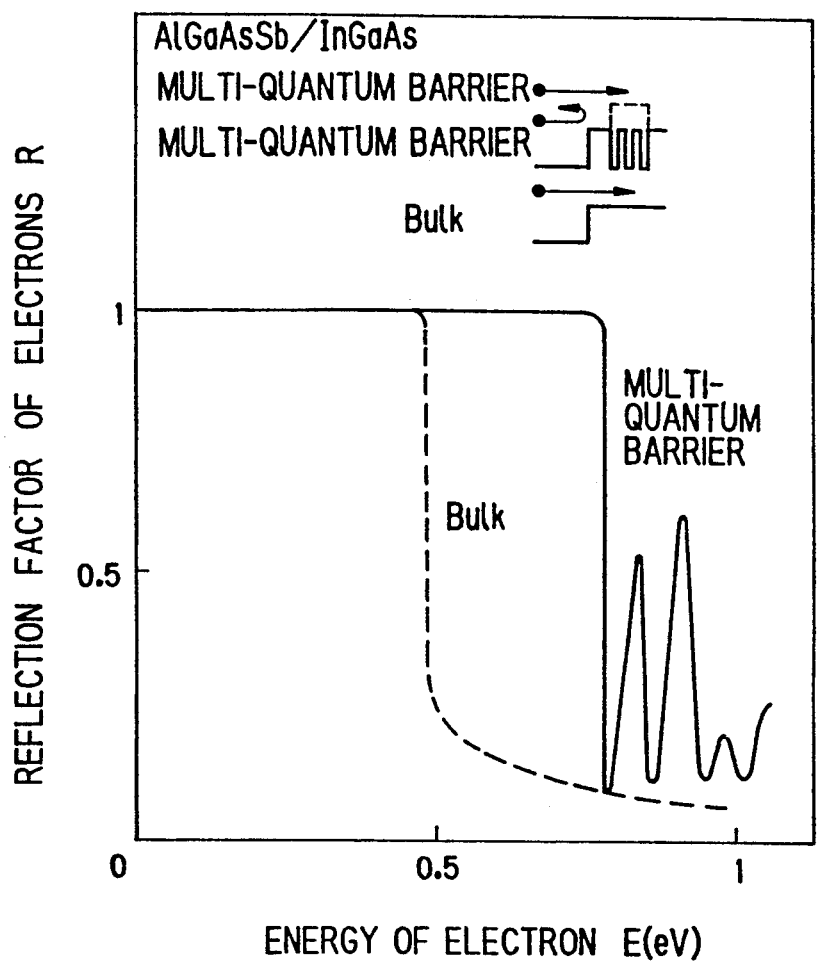
FIG. 7 is a graph showing a reflection factor of electrons correlating to energu of electrons in the structure shown in FIG. 6.

FIG. 7 shows a reflection factor of electrons correlating to energy of electrons in the multi-quantum barrier and the bulk interface in the third avalanche multiplication layer structure shown in FIG. 6. In the band energy structure, the same effect observed in FIG. 3 can be expected as shown in FIG. 7, and the reflection factor of electrons in the multi-quantum barrier is 1.6 times larger than that in the bulk barrier.

Next, the avalanche photodiode in the third preferred embodiment will be explained in more detail in conjunction with FIGS. 8A and 8B. The avalanche photodiode has the same structure as that of the avalanche photodiode in the first preferred embodiment, except that an avalanche multiplication layer 25 has an 16-period hetero-structure of an AlGaAsSb-barrier layer having a thickness of 500 Å and an InGaAs-well layer having a thickness of 250 Å. The barrier layer consists of an electron transmission preventing layer of AlGaAsSb having a thickness of 100 Å and a multi-quantum barrier layer having a 5-period structure of AlGaAsSb having a thickness of 30 Å and InGaAs having a thickness of 20 Å.

Figure 8:
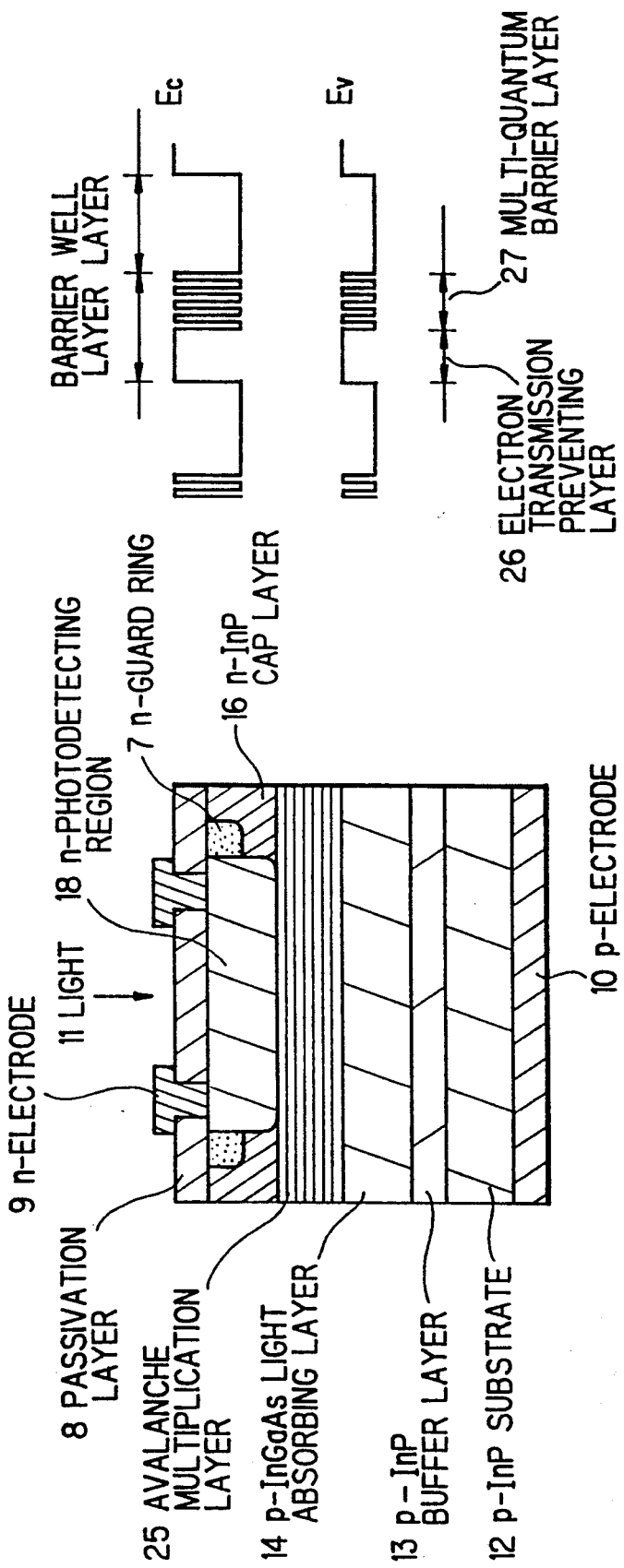
FIG. 8A is a cross-sectional view illustrating the avalanche photodiode in the third preferred embodiment according to the invention.
FIG. 8B is a simplified model illustrating the band energy in the avalanche multiplication layer of the avalanche photodiode in FIG. 8A.

The basic figure of the band energy in the avalanche multiplication layer 25 of the avalanche photodiode in the third preferred embodiment shown in FIG. 8B is the same as that shown in FIG. 6, and operation thereof is the same as that in the first and second preferred embodiments, so that the operation will not explained here. In the avalanche photodiode, an effective ionization ratio $\alpha/\beta$ becomes as large as 110. Further, the quantum efficiency becomes 80%, so that low-noise and high-response characteristics are realized in the avalanche photodiode. In the avalanche photodiode in the third preferred embodiment, the well layer of InGaAs may be replaced by that of AlGaInAs. In such a structure, the band energy discontinuity $\Delta E_V$ in the valence band becomes zero, so that higher speed response characteristic can be obtained in the avalanche photodiode.

Figure 9:
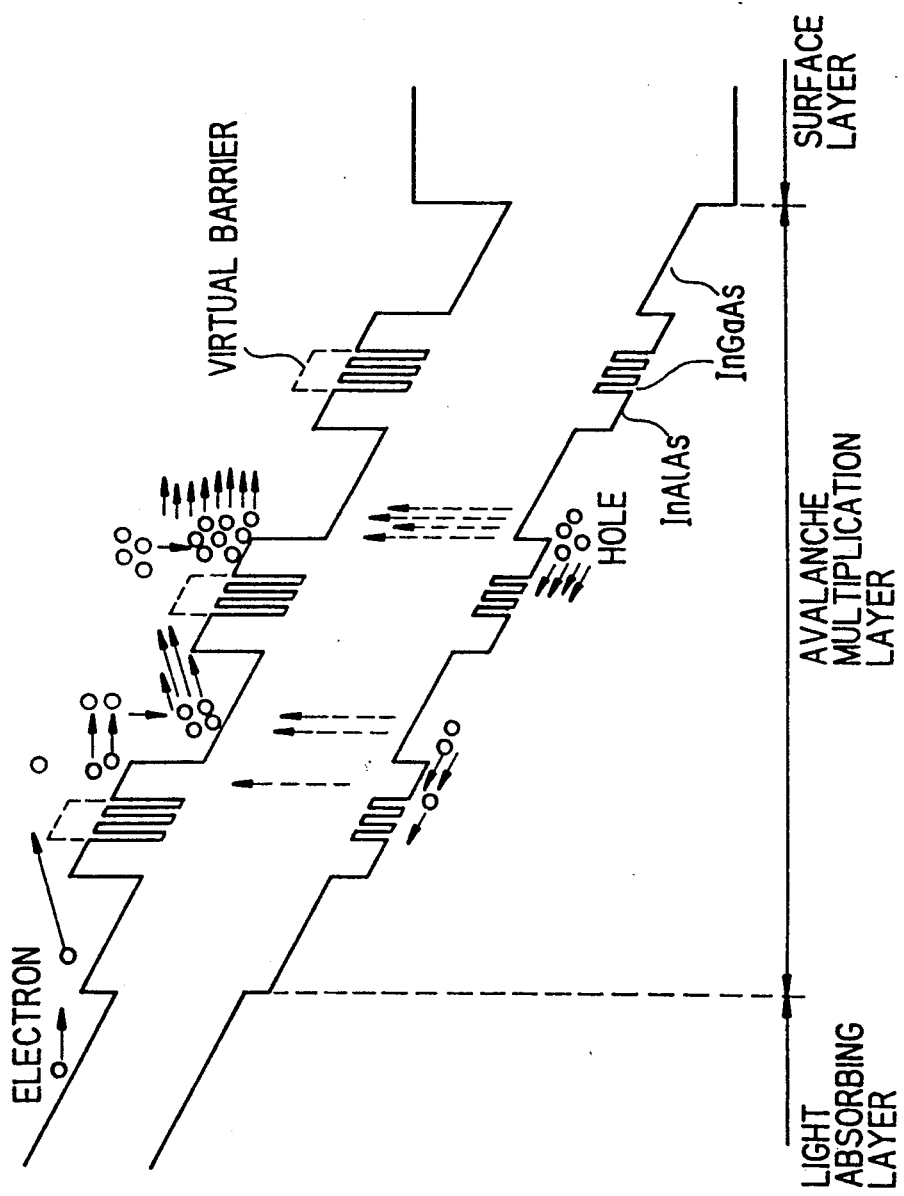
FIG. 9 is a simplified model illustrating the band energy for explaining an avalanche multiplication layer structure of an avalanche photodiode in a fourth preferred embodiment according to the invention.

Next, FIG. 9 shows the band energy for explaining a structure of an avalanche multiplication layer of an avalanche photodiode in a fourth preferred embodiment. The avalanche multiplication layer has a hetero-periodical structure including a barrier layer consisting of an electron transmission preventing layer of $In_xAl_{1-x}As$ ($0 \leq x \leq 1$), a multi-quantum barrier layer of $In_xAl_{1-x}As/In_yGa_{1-y}As$ ($0 \leq x \leq 1$, $0 \leq y \leq 1$) and an $In_xAl_{1-x}As$ ($0 \leq x \leq 1$), and a well layer of $In_yGa_{1-y}As$ ($0 \leq y \leq 1$). A virtual barrier higher than the real barrier is generated at the multi-quantum barrier layer, as like in FIG. 2 or 6, and the electrons obtain a large ionizing energy.

Figure 10:
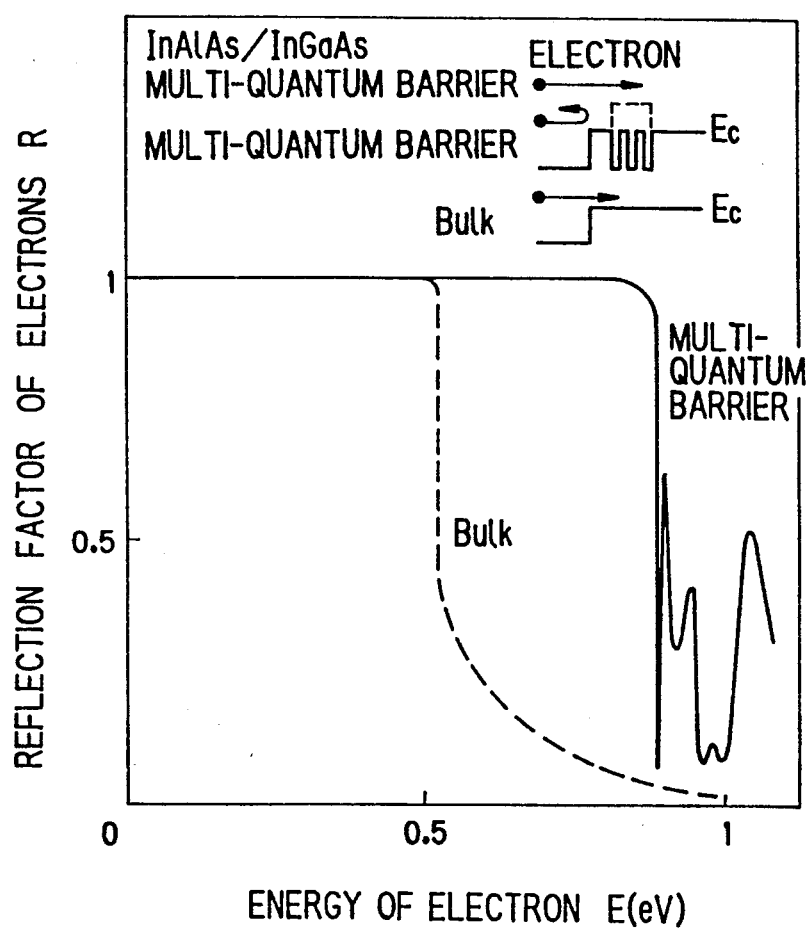
FIG. 10 is a graph showing a reflection factor of electrons correlating to energy of electrons in the structure shown in FIG. 9.

FIG. 10 shows a reflection factor of electrons correlating to energy of electrons in the multi-quantum barrier and the bulk interface in the third avalanche multiplication layer structure shown in FIG. 9. In such a band structure, the reflection factor of electrons in the multi-quantum barrier is 1.7 times larger than that in the bulk barrier.

Figure 11A:
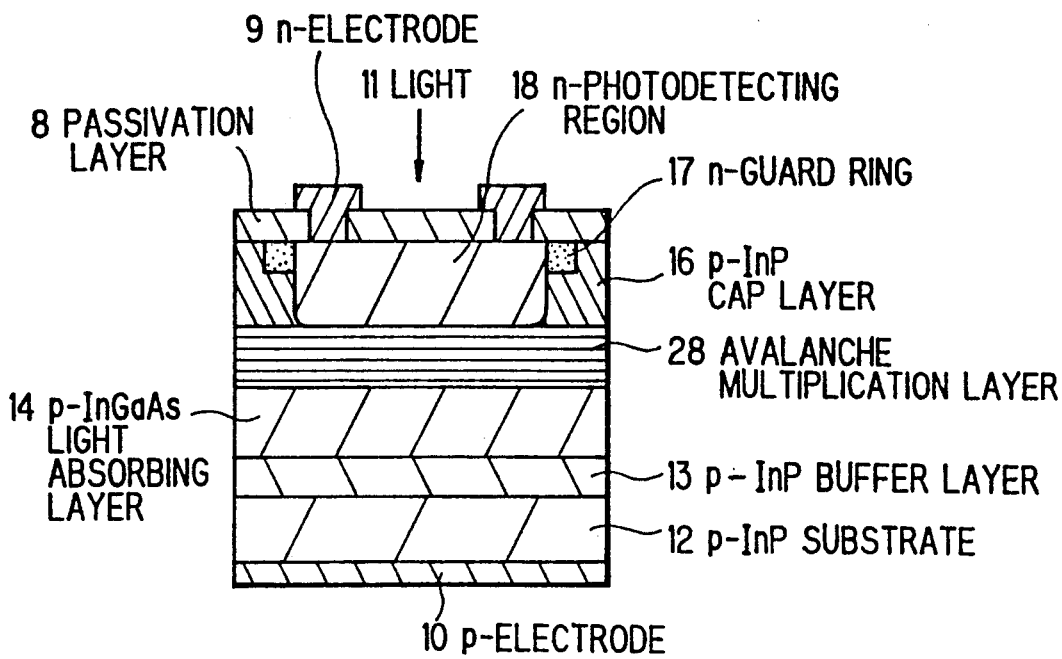
FIG. 11A is a cross-sectional view illustrating the avalanche photodiode in the fourth preferred embodiment according to the invention.

Next, the avalanche photodiode in the fourth preferred embodiment will be explained in more detail in conjunction with FIGS. 11A and 11B. The avalanche photodiode has the same structure as that of the avalanche photodiode in the first preferred embodiment, except that an avalanche multiplication layer 28 has a 16-period hetero-structure of an InAlAs-barrier layer having a thickness of 500 Å and an InGaAs-well layer having a thickness of 250 Å. The barrier layer consists of an electron transmission preventing layer 29 of InAlAs having a thickness of 100 Å, a multi-quantum barrier layer 30 having a 5-period structure of InAlAs having a thickness of 30 Å and InGaAs having a thickness of 20 Å, and an InAlAs barrier layer 31 having a thickness of 150 Å.

Figure 11B:
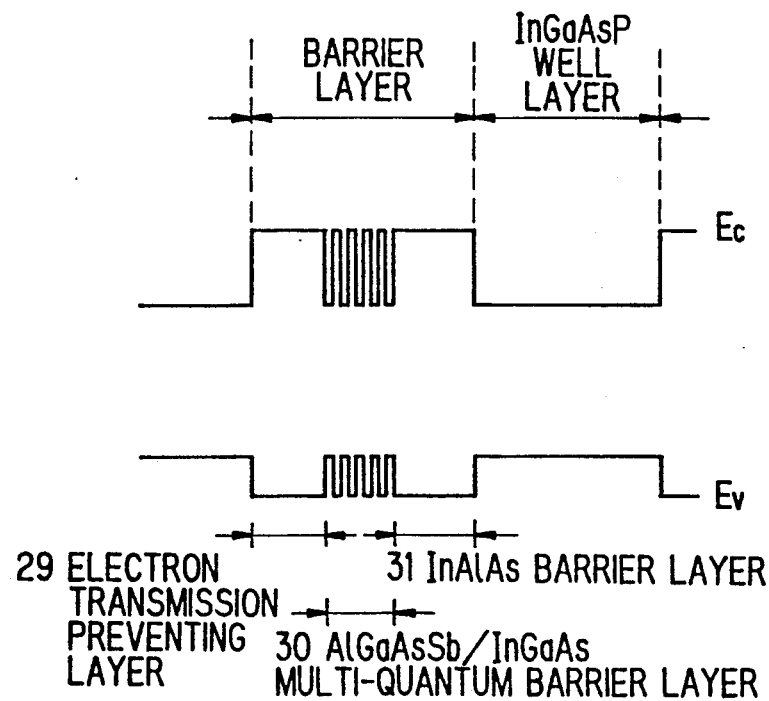

The basic figure of the band energy in the avalanche multiplication layer 28 of the avalanche photodiode in the fourth preferred embodiment shown in FIG. 11B is the same as that shown in FIG. 9, and operation thereof is the same as that in the first to third preferred embodiments, so that the operation will not explained here. In the avalanche photodiode, an effective ionization ratio $\alpha/\beta$ becomes as large as 100. Further, the quantum efficiency becomes 80%, so that low-noise and high speed response characteristics are realized in the avalanche photodiode.

Next, an avalanche photodiode in a fifth preferred embodiment will be explained in conjunction with FIG. 12. The avalanche photodiode has the same structure as that of the avalanche photodiode in the fifth preferred embodiment, except that a well layer of an avalanche multiplication layer consists of InGaAsP having a thickness of 200 Å instead of InGaAs having a thickness of 250 Å. The basic figure of the band energy in the avalanche multiplication layer of the avalanche photodiode in the fifth preferred embodiment shown in FIG. 11B is the same as that shown in FIG. 9, except that there is almost no band energy discontinuity $\Delta E_V$ between the well layer and the barrier layer which falls within the valence band, so that the pile-up of the holes does not occur. Therefore, higher speed response characteristic can be obtained in the avalanche photodiode.

Figure 13:
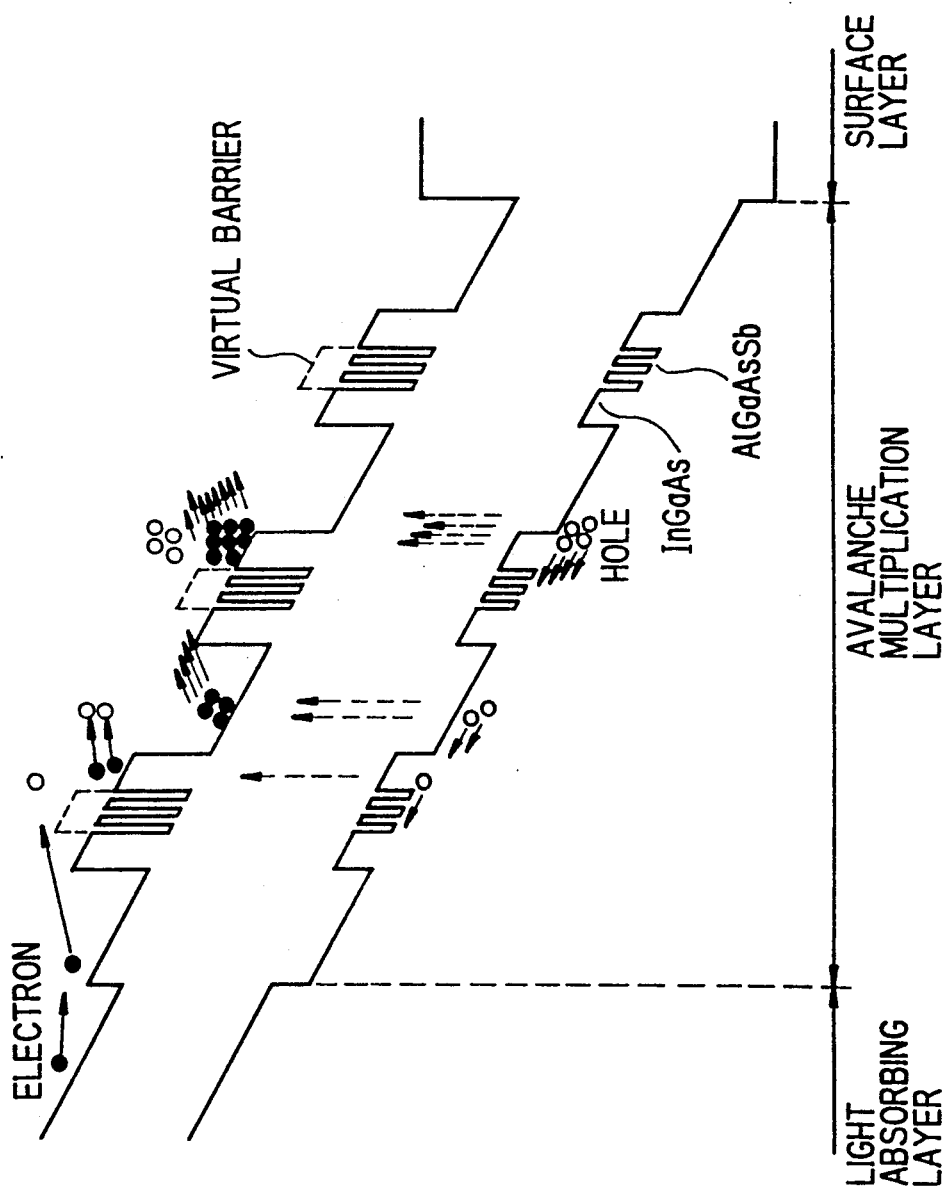
FIG. 13 is a simplified model illustrating the band energy for explaining an avalanche multiplication layer structure of an avalanche photodiode in a sixth preferred embodiment according to the invention.

Next, an avalanche photodiode in a sixth preferred embodiment will be explained. As shown in FIG. 13, an avalanche multiplication layer of the avalanche photodiode in the sixth preferred embodiment has a heteroperiodical structure including a barrier layer consisting of an electron transmission preventing layer of $Al_xGa_{1-x}As_ySb_{1-y}$ ($0 \leq x \leq 1$, $0 \leq y \leq 1$), a multi-quantum barrier layer of $Al_xGa_{1-x}As_ySb_{1-y}/In_zGa_{1-z}As$ ($0 \leq x \leq 1$, $0 \leq y \leq 1$, $0 \leq z \leq 1$) and a well layer of $In_zGa_{1-z}As$ ($0 \leq z \leq 1$). A virtual barrier higher than the real barrier is generated at the multi-quantum barrier layer, and the electrons obtain a large ionizing energy.

Figure 14:
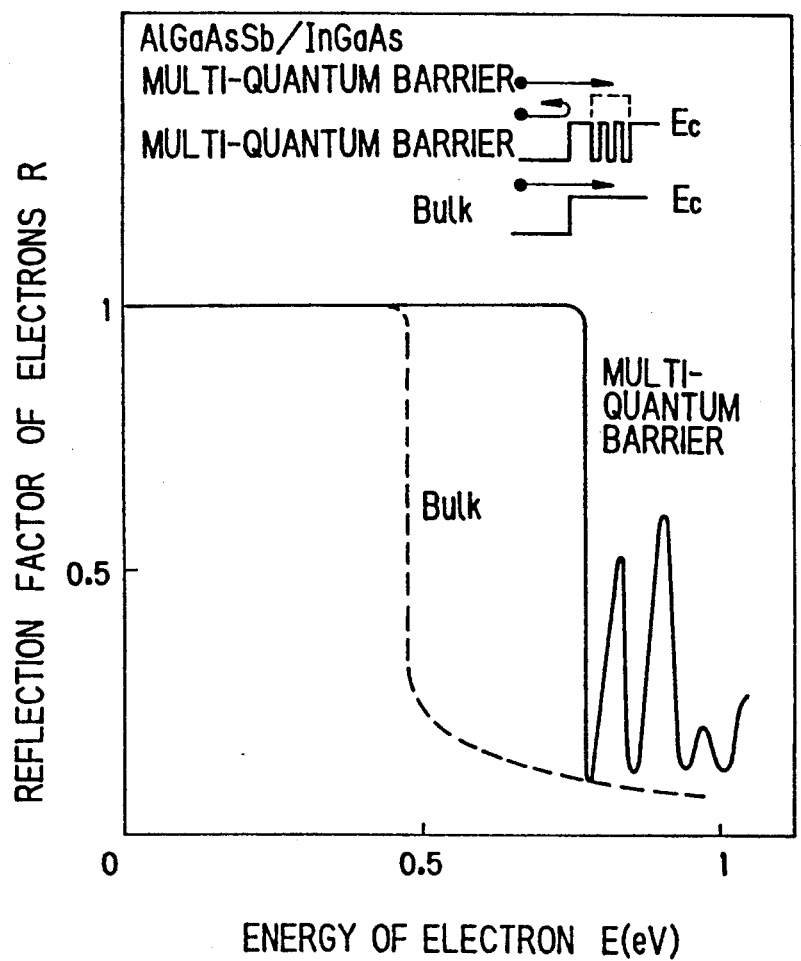
FIG. 14 is a graph showing a reflection factor of electrons correlating to energy of electrons in the structure shown in FIG. 13.

FIG. 14 shows a reflection factor of electrons correlating to energy of electrons in the multi-quantum barrier and the bulk interface in the fifth avalanche multiplication layer structure shown in FIG. 13. In the band energy structure, the same effect observed in FIG. 7 can be expected as shown in FIG. 14, and the reflection factor of electrons in the multi-quantum barrier is 1.6 times larger than that in the bulk barrier.

Next, the avalanche photodiode in the sixth preferred embodiment will be explained in more detail in conjunction with FIGS. 15A and 15B. The avalanche photodiode has the same structure as that of the avalanche photodiode in the sixth preferred embodiment, except that an avalanche multiplication layer 35 has an 16-period hetero-structure of an AlGaAsSb-barrier layer having a thickness of 500 Å and an InGaAs-well layer having a thickness of 250 Å. The barrier layer consists of an electron transmission preventing layer of AlGaAsSb having a thickness of 100 Å, a multi-quantum barrier layer having a 5-period structure of AlGaAsSb having a thickness of 30 Å and InGaAs having a thickness of 20 Å, and an AlGaAsSb barrier layer having a thickness of 150 Å.

The basic figure of the band energy in the avalanche multiplication layer 35 of the avalanche photodiode in the sixth preferred embodiment shown in FIG. 15B is the same as that shown in FIG. 13, and operation thereof is the same as that in the first to fifth preferred embodiments, so that the operation will not explained here. In the avalanche photodiode, an effective ionization ratio $\alpha/\beta$ becomes as large as 90. Further, the quantum efficiency becomes 80%, so that low-noise and high speed response characteristics are realized in the avalanche photodiode. In the avalanche photodiode in the sixth preferred embodiment, the well layer of InGaAs may be replaced by that of AlGaInAs. In such a structure, the band energy discontinuity in the valence band becomes zero, so that higher speed response characteristic can be obtained in the avalanche photodiode.

Although the invention has been described with respect to specific embodiments for a complete and clear disclosure, the appended claims are not to be thus limited and should include alternative constructions that may occur to one skilled in the art which fairly fall within the basic teaching herein set forth.

What is claimed is:

1. An avalanche photodiode, comprising:
   a light absorbing layer;
   an avalanche multiplication layer of a hetero-periodical structure comprising alternately provided first barrier and well layers, each of said first barrier layers of said avalanche multiplication layer comprising a multi-quantum barrier layer having alternately provided narrow-width barrier and well layers, a virtual barrier being formed which is higher than said first barrier and is generated at the multi-quantum barrier layer, so that electrons which are injected into the avalanche multiplication layer experience large energy differences between the virtual barrier and the well layer so that electrons obtain a large ionizing energy; and
   first and second electrodes for applying a predetermined voltage across said light absorbing and avalanche multiplication layers;
   wherein said narrow-width barrier and well layers comprise respectively first and second group III–V compounds which meet the following conditions:

$$E_A < E_B, \text{ and } E_A + E_{gA} < E_B + E_{gB}$$

where $E_A$ and $E_B$ are average ionization energies of said first and second group III–V compounds, respectively, and $E_{gA}$ and $E_{gB}$ are forbidden band gap energies, respectively.

2. An avalanche photodiode, according to claim 1, wherein:
   said multi-quantum barrier layer is provided in a center of said first barrier layer.

3. An avalanche photodiode, according to claim 1, wherein:
   said multi-quantum barrier layer is provided in one end of said first barrier layer in which photocarriers which drift within said avalanche multiplication layer reach said multi-quantum barrier layer after passing said first barrier layer.

4. An avalanche photodiode, according to claim 1, wherein:
   said first barrier layer comprises InAlAs;
   said well layer consists of InGaAs; and
   said narrow-width barrier and well layers of said multi-quantum barrier layer consist of InAlAs and InGaAs, respectively.

5. An avalanche photodiode, according to claim 1, wherein:
   said first barrier layer consists of InAlAs;
   said well layer consists of InGaAsP; and
   said narrow-width barrier and well layers of said multi-quantum barrier layer consist of InAlAs and InGaAs, respectively;
   wherein a band energy discontinuity between said barrier layer and well layers falls within a valence band.

6. An avalanche photodiode, according to claim 1, wherein:
   said first barrier layer comprises AlGaAsSb;
   said well layer consists of InGaAs; and
   said narrow-width barrier and well layers of said multi-quantum barrier layer consist of AlGaAsSb and InGaAs, respectively.

7. An avalanche photodiode, according to claim 1, wherein:

said first barrier layer consists of AlGaAsSb;
said well layer consists of AlGaInAs; and
said narrow-width barrier and well layers of said multi-quantum barrier layer consist of AlGasAsSb and InGaAs, respectively;
wherein a band energy discontinuity between said first barrier and well layers falls within a valence band.

8. An avalanche photodiode, comprising:
a light absorbing layer;
an avalanche multiplication layer of a hetero-periodical structure consisting of alternately provided first barrier and well layers, each of said first barrier layers of said avalanche multiplication layer comprising a multi-quantum barrier layer consisting of alternately provided narrow-width barrier and well layers; and
first and second electrodes for applying a predetermined voltage across said light absorbing and avalanche multiplication layers;
wherein said first barrier and well layers comprise respectively first and second group III-V compounds which meet the following conditions:

$$E_A < E_B, \text{ and } E_A + E_{gA} > E_B + E_{gB}$$

where $E_A$ and $E_B$ are average ionization energies of said first and second group III-V compounds, respectively, and $E_{gA}$ and $E_{gB}$ are forbidden band gap energies, respectively.

9. An avalanche photodiode, according to claim 8, wherein:
said multi-quantum barrier layer is provided in a center of said first barrier layer.

10. An avalanche photodiode, according to claim 8, wherein:
said multi-quantum barrier layer is provided in one end of said first barrier layer in which photocarriers which drift within said avalanche multiplication layer reach said multi-quantum barrier layer after passing said first barrier layer.

11. An avalanche photodiode, according to claim 8, wherein:
said first barrier layer comprises InAlAs;
said well layer comprises InGaAs; and
said narrow-width barrier and well layers of said multi-quantum barrier layer comprise InAlAs and InGaAs, respectively.

12. An avalanche photodiode, according to claim 8, wherein:
said first barrier layer comprises InAlAs;
said well layer comprises InGaAsP; and
said narrow-width barrier and well layers of said multi-quantum barrier layer comprise InAlAs and InGaAs, respectively;
wherein a band energy discontinuity between said first barrier and well layers falls within a valence band.

* * * * *